(12) United States Patent
Coenen et al.

(10) Patent No.: US 10,725,387 B2
(45) Date of Patent: Jul. 28, 2020

(54) DETERMINING AN EDGE ROUGHNESS PARAMETER OF A PERIODIC STRUCTURE

(71) Applicant: ASML Netherlands B.V., Veldhoven (NL)

(72) Inventors: Teis Johan Coenen, Vught (NL); Sander Bas Roobol, Veldhoven (NL); Sipke Jacob Bijlsma, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/028,917

(22) Filed: Jul. 6, 2018

(65) Prior Publication Data
US 2019/0025706 A1    Jan. 24, 2019

(30) Foreign Application Priority Data

Jul. 24, 2017 (EP) .................................... 17182817

(51) Int. Cl.
*G03F 7/20* (2006.01)
*G01N 21/88* (2006.01)
(Continued)

(52) U.S. Cl.
CPC ........... *G03F 7/7065* (2013.01); *G01B 15/08* (2013.01); *G01N 21/4788* (2013.01);
(Continued)

(58) Field of Classification Search
CPC .. G03F 7/70625; G03F 7/7065; G03F 9/7049; G01B 11/303; G01B 15/08; G01N 21/4788; G01N 21/8806
See application file for complete search history.

(56) References Cited

U.S. PATENT DOCUMENTS

| 5,361,137 A | 11/1994 | Aton et al. |
| 6,423,977 B1 * | 7/2002 | Hayasaki ............. G01N 21/956 250/559.19 |

(Continued)

FOREIGN PATENT DOCUMENTS

| CN | 103427323 B | 12/2013 |
| EP | 3 296 723 A1 | 3/2018 |

(Continued)

OTHER PUBLICATIONS

Bunday et al., "Influence of Metrology Error in Measurement of Line Edge Roughness Power Spectral Density," Metrology, Inspection, and Process Control for Microlithography XXVIII, Proc. SPIE, vol. 9050, 2014; pp. 1-16.
(Continued)

*Primary Examiner* — Sang H Nguyen
(74) *Attorney, Agent, or Firm* — Sterne, Kessler, Goldstein & Fox P.L.L.C.

(57) ABSTRACT

In a method of determining an edge roughness parameter of a periodic structure, the periodic structure is illuminated (602) in an inspection apparatus. The illumination radiation beam may comprise radiation with a wavelength in the range 1 nm to 100 nm. A scattering signal (604) is obtained from a radiation beam scattered from the periodic structure. The scattering signal comprises a scattering intensity signal that is obtained by detecting an image of a far-field diffraction pattern in the inspection apparatus. An edge roughness parameter, such as Lined Edge Roughness and/or Line Width Roughness is determined (606) based on a distribution of the scattering intensity signal around a non-specular diffraction order. This may be done for example using a peak broadening model.

20 Claims, 6 Drawing Sheets

(51) Int. Cl.
*G03F 9/00* (2006.01)
*G01N 21/47* (2006.01)
*G01B 15/08* (2006.01)
*G01B 11/30* (2006.01)

(52) U.S. Cl.
CPC ..... *G01N 21/8806* (2013.01); *G03F 7/70625* (2013.01); *G03F 9/7049* (2013.01); *G01B 11/303* (2013.01); *G01B 2210/56* (2013.01)

(56) References Cited

U.S. PATENT DOCUMENTS

| | | | | |
|---|---|---|---|---|
| 7,545,520 | B2* | 6/2009 | Lee | G03F 7/70625 |
| | | | | 356/625 |
| 8,045,179 | B1* | 10/2011 | Zhuang | G01B 11/303 |
| | | | | 356/600 |
| 2004/0218192 | A1 | 11/2004 | Bischoff et al. | |
| 2010/0124370 | A1* | 5/2010 | Saito | G06K 9/4661 |
| | | | | 382/141 |
| 2011/0027704 | A1* | 2/2011 | Cramer | G03F 7/70641 |
| | | | | 430/30 |
| 2012/0008150 | A1* | 1/2012 | Smith | G01B 11/0608 |
| | | | | 356/616 |
| 2012/0123748 | A1* | 5/2012 | Aben | G03F 7/70483 |
| | | | | 703/2 |
| 2012/0242970 | A1* | 9/2012 | Smilde | G03F 7/70483 |
| | | | | 355/77 |
| 2013/0132036 | A1* | 5/2013 | Saleh | G03F 7/70625 |
| | | | | 702/189 |
| 2014/0028993 | A1* | 1/2014 | Brill | G03F 7/70516 |
| | | | | 355/77 |
| 2014/0222380 | A1* | 8/2014 | Kuznetsov | G01N 21/4788 |
| | | | | 702/189 |
| 2015/0117610 | A1* | 4/2015 | Veldman | G03F 7/70633 |
| | | | | 378/71 |
| 2015/0293458 | A1* | 10/2015 | Vanoppen | G03F 7/70558 |
| | | | | 355/53 |
| 2016/0154319 | A1* | 6/2016 | Mossavat | G03F 7/705 |
| | | | | 355/67 |
| 2016/0223476 | A1* | 8/2016 | Quintanilha | G03F 7/70591 |
| 2016/0266056 | A1* | 9/2016 | Ruth | G01N 23/207 |
| 2016/0282282 | A1 | 9/2016 | Quintanilha et al. | |
| 2016/0313653 | A1* | 10/2016 | Mink | G03F 7/705 |
| 2017/0045823 | A1 | 2/2017 | Quintanilha | |
| 2017/0082536 | A1* | 3/2017 | Yeh | G01B 11/24 |
| 2017/0176338 | A1* | 6/2017 | Wu | G06T 7/90 |
| 2017/0184511 | A1 | 6/2017 | Den Boef et al. | |
| 2017/0255736 | A1* | 9/2017 | Van Leest | G03F 7/70633 |
| 2018/0321597 | A1* | 11/2018 | Javaheri | G01M 11/00 |

FOREIGN PATENT DOCUMENTS

| | | |
|---|---|---|
| EP | 3 321 739 A1 | 5/2018 |
| WO | WO 2015/172963 A1 | 11/2015 |
| WO | WO 2017/025392 A1 | 2/2017 |
| WO | WO 2017/108404 A1 | 6/2017 |
| WO | WO 2017/108410 A1 | 6/2017 |

OTHER PUBLICATIONS

Scholze et al., "Use of EUV scatterometry for the characterization of line profiles and line roughness on photomasks," 24th European Mask and Lithography Conference, Proc. SPIE, vol. 6792, 2008, pp. 1-9.

Jones et al., "Cross Section and Line Edge Roughness Metrology for EUV Lithography using Critical Dimension Small Angle X-ray Scattering," Intel, 4th International EUVL Symposium, Nov. 9, 2005; 18 pages.

Gross et al., "Modelling line edge roughness in periodic line-space structures by Fourier optics to improve scatterometry," Journal of the European Optical Society Rapid Publications, vol. 9, 2014; pp. 1-10.

Kato et al., "The effect of line roughness on the diffraction intensities in angular resolved scatterometry," Modeling Aspects in Optical Metrology III, Proc. of SPIE, vol. 8083, 2011; pp. 1-8.

* cited by examiner

DETERMINING AN EDGE ROUGHNESS PARAMETER OF A PERIODIC STRUCTURE

FIELD

The present disclosure relates to methods of determining an edge roughness parameter of a periodic structure, and inspection apparatus usable, for example, in the manufacture of devices by lithographic techniques. It also relates to associated targets, substrates, computer programs and computer program products.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

At the same time, the known inspection techniques employ radiation in the visible or ultraviolet waveband. This limits the smallest features that can be measured, so that the technique can no longer measure directly the smallest features made in modern lithographic processes. To allow measurement of smaller structures, it has been proposed to use radiation of shorter wavelengths, similar for example to the extreme ultraviolet (EUV) wavelengths used in EUV lithography. Such wavelengths may be in the range 1 to 100 nm, for example, or 1-125 nm. Part or all of this wavelength range may also be referred to as soft x-ray (SXR) wavelengths. Some authors may use SXR to refer to a narrower range of wavelengths, for example in the range 1-10 nm or 1-20 nm. For the purposes of the present disclosure, these terms SXR and EUV will be used without implying any hard distinction. Metrology using harder x-rays, for example in the range 0.1-1 nm is also contemplated. Examples of transmissive and reflective metrology techniques using these wavelengths in transmissive and/or reflective scattering modes are disclosed in published patent application WO2015172963A1. Further examples of metrology techniques and apparatuses using these wavelengths in transmissive and/or reflective scattering modes are disclosed in the published patent applications US2016282282A1, US2017045823A1, WO2017025392A1 and WO2017108404A1. The contents of all these applications are incorporated herein by reference.

Convenient sources of SXR radiation include higher harmonic generation (HHG) sources, in which infrared pump radiation from a laser is converted to shorter wavelength radiation by interaction with a gaseous medium. HHG sources are available for example from KMLabs, Boulder Colo., USA (http://www.kmlabs.com/). Various modifications of HHG sources are also under consideration for application in inspection apparatus for lithography. Some of these modifications are disclosed for example in European patent application number 16198346.5 dated Nov. 11, 2016, not having been published at the priority date of the present application. Other modifications are disclosed in the published patent applications US20170184511A1 and WO2017108410A1. European patent application no. 16188816.9 dated Sep. 14, 2016, not published at the present priority date, describes the correction of wavefronts in an HHG radiation source to minimize blurring of the measurement spot in an inspection apparatus. The contents of all of these applications are incorporated herein by reference.

The smallest feature size, the so-called Critical Dimension (CD), of new-generation integrated circuits (ICs) is continuously shrinking. Every next generation (so-called node) of lithography processes is facing even more difficult challenges than the previous one, an important example being Line Edge Roughness (LER). For the nodes below 100 nm the edges of lithography-fabricated IC structures can no longer be assumed to be straight lines since their nanometer-scale stochastic variations become a non-negligible fraction of the overall structures' dimensions, rendering the edges "rough". The 3σ Root Mean Square (RMS) value of the variations is what is called the Line Edge Roughness. When two rough edges form e.g., a line, its width is also statistically varying, this being known as Line Width Roughness (LWR). LER and LWR result in local CD variations, which may be quantified by a Local CD Uniformity (LCDU) value.

Currently the LER, LWR and LCDU of line patterns are typically characterized using CD-SEM (Critical Dimension Scanning Electron Microscopy). For example, LER measurements with CD-SEM may be based on CD measurements over multiple lengths of lines and deriving the roughness Power Spectral Density (PSD) from this. The PSD describes how power of a continuous signal is distributed over frequency. In the context of edge roughness, this is described in Bunday et. al., "Influence of metrology error in measurement of line edge roughness power spectral density", Proc. SPIE 9050, Metrology, Inspection, and Process Control for Microlithography XXVIII, 90500G (14 Apr. 2014). The contents of that publication are incorporated herein by reference.

A problem with CD-SEM measurement is that it is a very slow process. Multiple lines have to be measured with sufficient sample points to obtain a sufficiently representative LER parameter estimate. The insensitivity to low-frequent LER variations due to a limited field of view results typically in an underestimation of the LER.

Another approach to measuring LER is using small angle x-ray scattering, typically with hard x-rays, where transmitted Small-Angle X-ray Scattering (SAXS) or reflected Grazing-Incidence SAXS (GI-SAXS) x-ray beams are diffracted by the (material) lattice of the lines. The diffracted beams contain information on the material distribution, and thus the LER, of the lines.

Hard X-ray scatterometry has a drawback that compact bright sources are not available, and that transmission measurements (SAXS), through the whole wafer/wafer table, or under very small grazing angles (GI-SAXS: leading to very large spot size) are difficult to realize in a volume manufacturing environment, such as for semiconductor device manufacture.

For widely spaced lines (with many propagating diffraction orders), it is also known that that the diffraction intensity of the many orders taken together are sensitive to the LER of the lines. This method has been used in the DUV/EUV(SXR) wavelength range.

Determination of LER from the intensity of many diffraction orders has the drawback that these orders only propagate for large pitch/wavelength ratio which makes the method not usable for small on-product pitches, even in the SXR/EUV wavelength range.

SUMMARY OF THE INVENTION

The invention aims to improve the determination of edge roughness parameters.

The present invention in a first aspect provides a method of determining an edge roughness parameter of a periodic structure, the method comprising:

obtaining a scattering signal from a radiation beam scattered from the periodic structure; and determining an edge roughness parameter based on a distribution of the scattering signal around a non-specular diffraction order.

The present invention in a second aspect provides a target comprising a periodic structure that is periodic in more than one direction, and optimized for determining an edge roughness parameter in accordance with the method of the first aspect.

The present invention in a third aspect provides a substrate comprising a target according to the second aspect.

The present invention in a fourth aspect provides an inspection apparatus for inspection of a periodic structure on a substrate, the inspection apparatus comprising:

(a) a radiation source arranged to illuminate a region of the substrate with a radiation beam;

(b) a detector arranged to detect a scattered radiation beam reflected from the periodic structure so as to provide a scattering signal;

(c) a processor operable to control the inspection apparatus so as to carry out the method of the first aspect.

The invention in a fifth aspect provides a computer program comprising computer readable instructions which, when run on suitable computer apparatus, cause the computer apparatus to perform the method of the first aspect.

The invention further provides a computer program product comprising the computer program of the fifth aspect.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
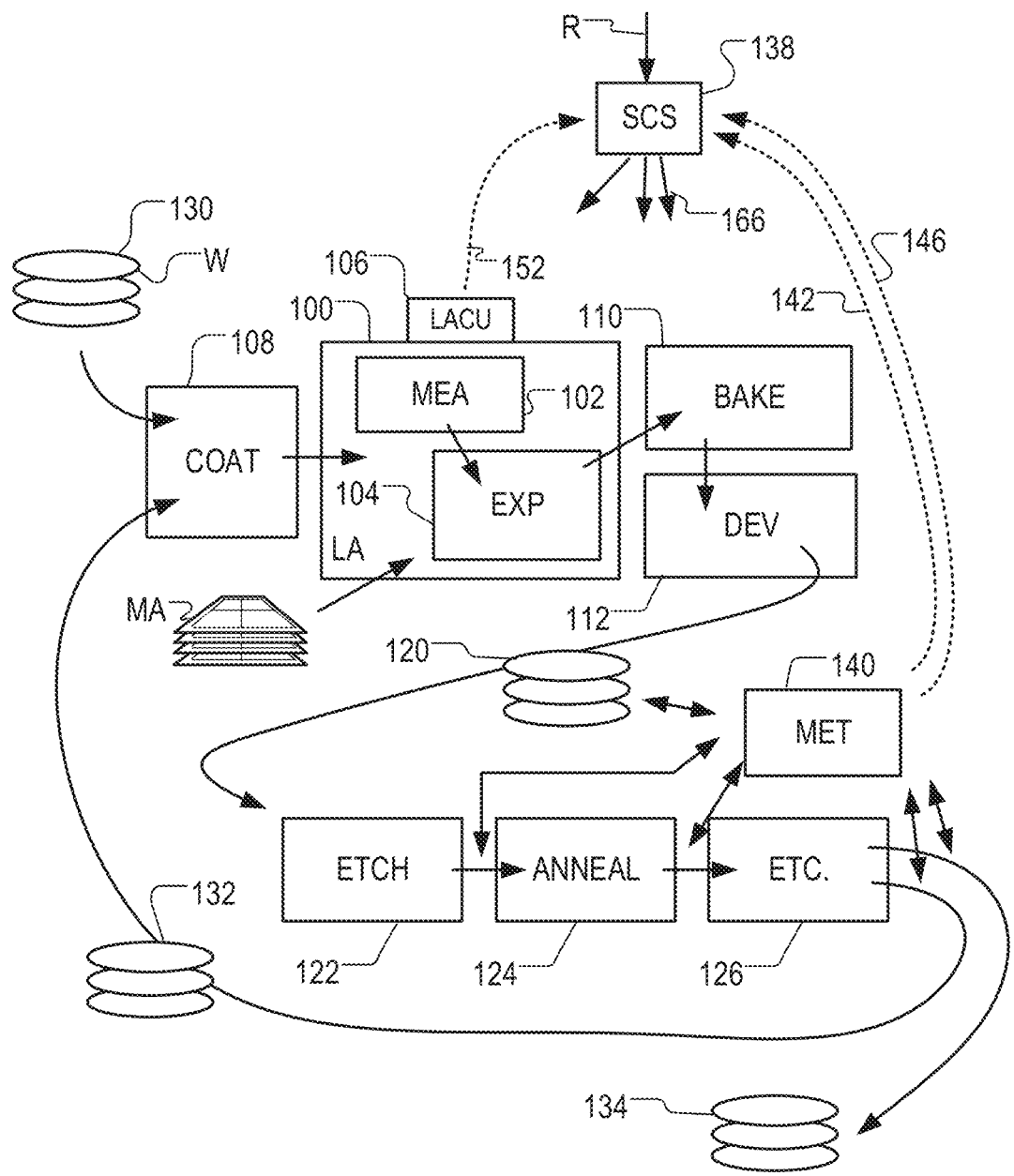
FIG. 1 depicts a lithographic apparatus together with other apparatuses forming a production facility for semiconductor devices, and including a metrology apparatus including an inspection apparatus according to an embodiment of the present invention.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, and 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Metrology apparatus 140 may if desired implement a hybrid metrology system. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122.

Each generation of lithographic manufacturing technology (commonly referred to as a technology "node") has tighter specifications for performance parameters such as CD. One of the main challenges in metrology is that the size of features within the product becomes smaller and smaller, and this smaller feature size should be reflected also in the design of metrology targets. Accordingly, metrology apparatus 140 may include an inspection apparatus designed to operate with radiation at wavelengths shorter than conventional visible or UV wavelengths. As a particular example, soft x-ray (SXR) radiation with wavelengths in the range 1-10 nm or 1-20 nm may be used, or more generally extreme ultraviolet EUV radiation may be used, with wavelengths in the range 1-100 nm.

Rather than rely for all purposes on a single inspection apparatus, a variety of inspection apparatuses may be used in practice. A hybrid metrology system may include scatterometers working at different wavelengths, and additional types of inspection apparatus, so that multiple types of measurement can be performed within the hybrid metrology system to obtain a better overall measurement of a parameter or parameters of interest on a given target structure.

Each of the inspection apparatuses within a hybrid metrology system can have a particular illumination system for radiation of a particular characteristic. More detailed examples of the types of apparatuses that can be combined are given in the published patent application WO2017108404A1, mentioned above. For the purposes of the present disclosure, it is assumed that metrology apparatus 140 is an inspection apparatus using soft x-ray (SXR or EUV) radiation in a waveband shorter than 100 nm. This SXR inspection apparatus can be applied as one of the inspection apparatuses in a hybrid metrology system, but can also be applied independently, if desired.

Figure 2:
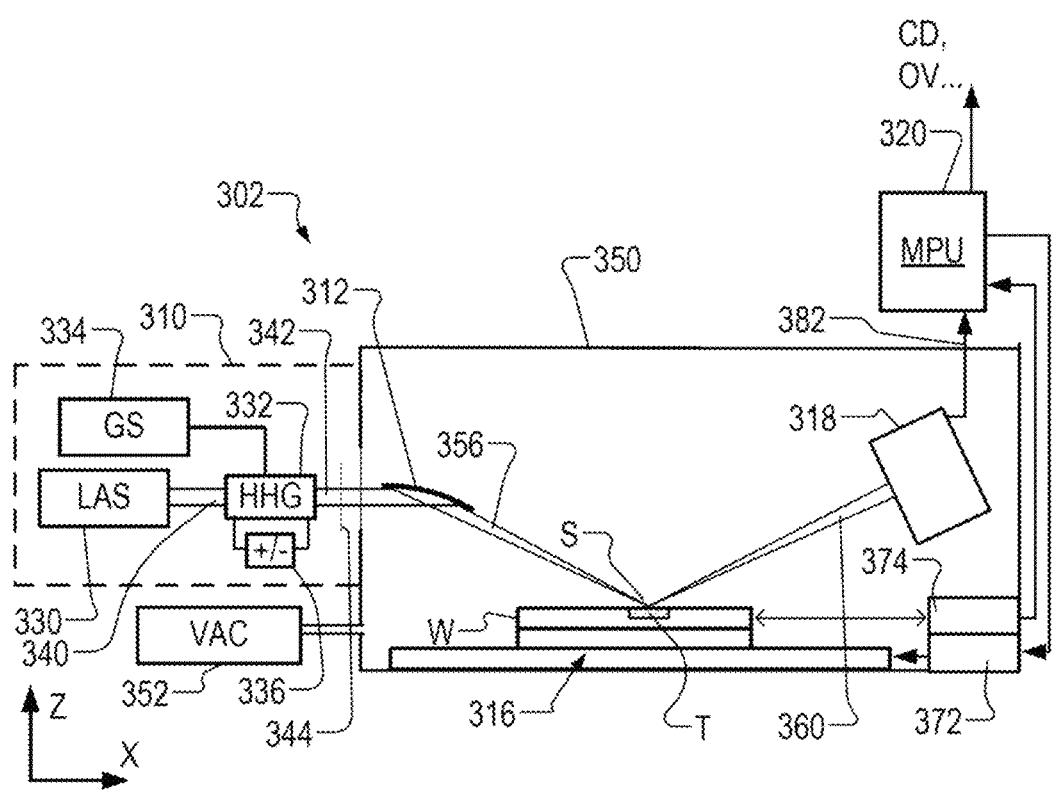
FIG. 2 shows schematically the arrangement of components in an embodiment of an inspection apparatus in which the present invention may be applied.

FIG. 2 illustrates a schematic physical arrangement of an inspection apparatus 302 comprising a spectroscopic scatterometer using EUV/SXR radiation, purely by way of example. An alternative form of inspection apparatus might be provided in the form of an angle-resolved scatterometer, which uses radiation in normal or near-normal incidence similar to the conventional scatterometers operating at longer wavelengths. Inspection apparatus 302 comprises a radiation source 310, illumination system 312, substrate support 316, detection system 318 and metrology processing unit (MPU) 320. Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser may be for example a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. One or more wavelengths in the range 1-20 nm or 1-10 nm may be chosen, for example. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published patent application WO2017108404A1, mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest.

Scattered radiation 360 is captured by detector 318 and a spectrum is provided to processor 320 for use in calculating a property of the target structure T. The illumination system 312 and detection system 318 thus form an inspection apparatus. This inspection apparatus may comprise an SXR spectroscopic reflectometer of the kind described in US2016282282A1. Tilting of the substrate in one or more dimensions may also be provided.

To aid the alignment and focusing of the spot S with desired product structures, inspection apparatus 300 may also provide auxiliary optics using auxiliary radiation under control of metrology processor 320. Metrology processor 320 can also communicate with a position controller 372 which operates the translation stage and rotation stages. Processor 320 receives highly accurate feedback on the position and orientation of the substrate, via sensors. Sensors 374 may include interferometers, for example, which can give accuracy in the region of picometers. In the operation of the inspection apparatus 300, spectrum data 382 captured by detection system 318 is delivered to metrology processing unit 320.

As mentioned an alternative form of inspection apparatus uses SXR radiation at normal incidence or near-normal incidence. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The SXR radiation may for example have wavelengths less than 100 nm, for example using radiation in the range 5-30 nm. The radiation may be narrowband or broadband in character.

Like the optical scatterometer used in today's production facilities, the inspection apparatus 140 can be used to measure structures within the resist material treated within the litho cell (After Develop Inspection or ADI), and/or to measure structures after they have been formed in harder material (After Etch Inspection or AEI). For example, substrates may be inspected using metrology apparatus 140 after they have been processed by the developing apparatus 112, etching apparatus 122, annealing apparatus 124 and/or other apparatus 126.

The inspection apparatus of FIG. 2 may be used in embodiments of the present invention to determine edge roughness parameters, which are types of performance parameters.

Edge roughness parameters may comprise line edge roughness (LER), line width roughness (LWR), and local CD uniformity (LCDU), which itself may be derived from LER and LWR. Edge roughness parameters may represent the "amplitude" of the roughness, and may also represent the "frequency" (or frequency distribution) of the roughness. The frequencies can be distinguished from the angular distribution of the scattered radiation around the nominal diffraction order radiation. Discrete roughness frequencies will appear as discrete diffraction peaks, which are oriented angularly orthogonal to the diffraction pattern of the smooth periodic structure. Edge roughness parameters determined from grating target are averaged over a number of edges of the lines of the target.

Illumination of a region S of a substrate W with a radiation beam 356, when there is a periodic structure (such as part of target T) in the region, leads to scattered radiation 360 having diffraction orders. The detector 318 produces a scattering signal 382, which encodes the spectrum data that represents the diffraction orders of the scattered radiation 360. The diffraction orders may be represented as peaks in the spectrum data. For example, when the scattering signal is an intensity signal, peaks in the intensity as a function of wavelength are diffraction orders. The scattering signal may be analogue or digitally encoded. Typically it is an electrical signal.

Deviation from periodicity of the periodic structure is interpreted as edge roughness. The roughness of individual periodic features (such as lines) in the periodic structure leads to a change in the distribution around diffraction orders in the scattered radiation 360 and in the scattering signal 382. Thus, roughness information is encoded in the diffraction order in the scattering signal. Edge roughness parameters such as LER and/or LWR can be determined from the scattering signal intensity distribution around a diffraction order.

Embodiments measure the distribution of the scattering intensity around non-specular diffraction orders to determine LER. Since only (at least) one diffraction order is required, this method can be applied to product pitches (e.g.

18-90 nm) and using the soft x-ray or Extreme Ultraviolet (EUV) wavelength regime (1 nm to 100 nm, or, optionally ~5 nm to 50 nm, or, optionally ~10 nm to 20 nm). Suitable compact sources (Laser Produced Plasma/Discharge Produced Plasma/HHG) exist, or are being developed, for this wavelength regime. Moderate or near-normal angles of incidence can be employed in such a sensor, allowing small spots hence supporting the use of small targets. Moreover, the optical paths for imaging of the diffraction orders do not need additional gratings or focusing optics to implement broadband spectrometric detection.

Standard SAXS/GI-SAXS with hard X-rays operates around the specular/reflected beam. In contrast, in embodiments of the present invention that use the soft X-ray regime, wide angle scattering from the grating periodicities leads to diffraction peaks, which are convoluted from additional scattering due to roughness.

We will now describe how LER/LWR can be measured from the intensity distribution around a diffraction peak. When an electromagnetic wave impinges on a 1D-periodic structure (i.e. grating or line structure), it will be diffracted dependent on the pitch of the structure. A perfect 1D-periodic line will repeat infinitely in the periodic direction and is invariant along the length of the line. Such a 1D-periodic structure will only exhibit diffraction orders that can be identified with a single order index, which we will label h. However, in practice a line will exhibit fluctuations (LER or LWR), in the non-periodic direction. For periodic width variations, this will result in discrete diffraction orders that can be identified with an additional order index, k. Hence, there will be a 2D lattice of diffraction orders labeled by hk. The intensity in these orders along the k direction corresponds in a way to the amplitude of the periodic line variations, and the position of these orders corresponds to the periodicity—similar to the h direction which gives information on the periodicity in the direction of the grating period.

For realistic LER or LWR (described as a continuous spectral density function), there will not appear discrete orders in the k direction. Instead, a broad, continuous intensity distribution will form in the k direction around the diffraction orders in the h direction. The intensities close to the diffraction order will correspond to low-frequency fluctuations in the LER/LWR, while the intensities at large distance from the order will correspond to rapid fluctuations in the LER/LWR. The measured intensity distribution around this diffraction order can in this way be related to a spectral density distribution of the line roughness.

Note that this explanation holds for any diffraction order, including the specular (0th order). The intensity distribution around the specular beam can be seen as originating from 'small angle scattering', hence giving name to the technique SAXS. The small angles are formed by scattering from large periodicities/structures compared to the wavelength.

Figure 3A:
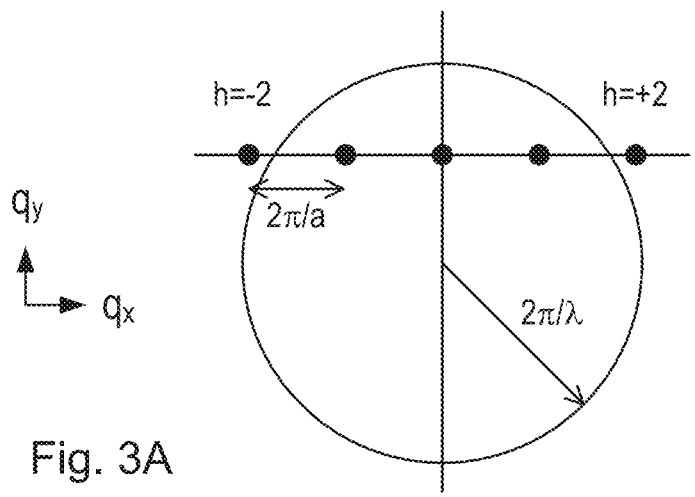
FIGS. 3A to 3C show schematically diffraction orders in k-space for a 1-D periodic structure with no roughness, periodic roughness and stochastic roughness respectively, all with monochromatic illumination.
Figure 3B:
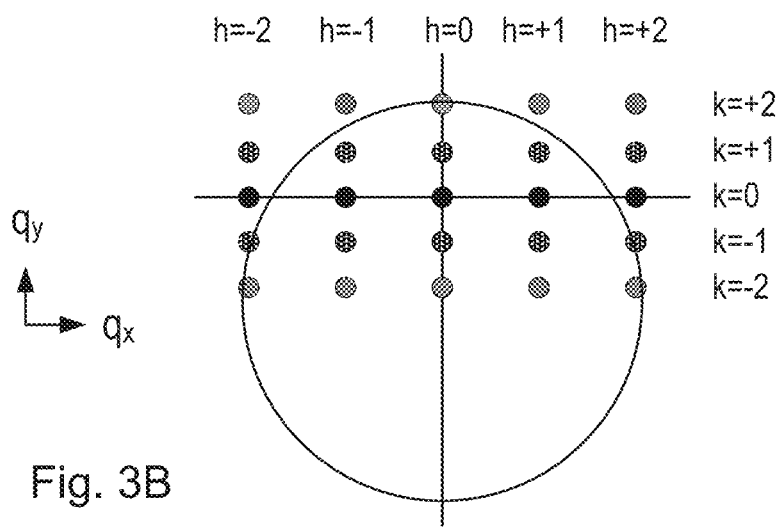
Figure 3C:
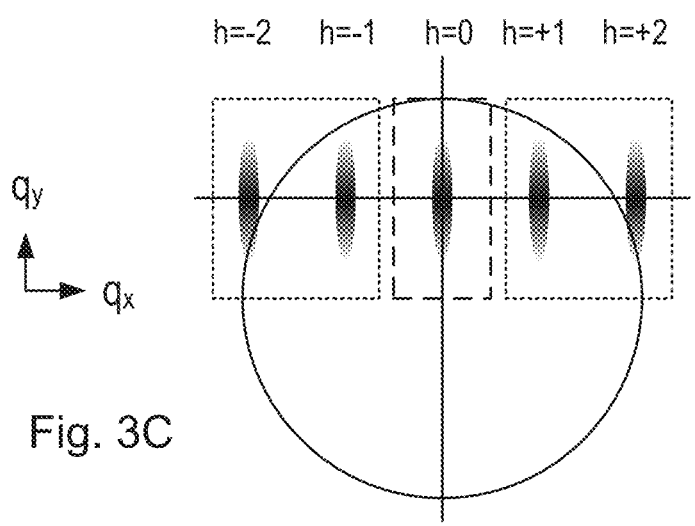

FIGS. 3A to 3C illustrate the principle, using the concept of reciprocal space or k-space, with $q_x$ and $q_y$ axes. FIGS. 3A to 3C show schematically diffraction orders in k-space for a 1-D periodic structures with no roughness, periodic roughness and stochastic roughness respectively, all with monochromatic illumination.

FIG. 3A relates to an ideal 1D periodic grating. The black dots represent diffraction orders, which are labeled with an index h from −2 to +2. The large circle is the projection of the Ewald sphere onto the $q_z=0$ plane. Diffraction orders within this circle are propagating and can be detected. As the grating is presumed ideal, the diffraction orders are infinitely narrow delta peaks. The intensity in each peak encodes information about the precise grating geometry.

With reference to FIG. 3B, ideal periodic line width variation with a single frequency is added in the y direction as a simple example of periodic line width variation. In this case with the added period corresponding to the single frequency is larger than the grating period. The added variation may be achieved by modulating the width of one or both edges of each line in the ideal grating. Both LER and LWR can be added. When both have the same frequency, they will have a different diffraction 'fingerprint' as LER has an asymmetric nature and LWR a symmetric nature. The asymmetric LER will be most pronounced in the odd diffraction indices k. This gives rise to a 2D lattice of peaks in reciprocal space, where the $q_y$ direction is typically labeled by integers k. Shown are only k values from −2 to +2 but the lattice extends infinitely, however typically intensities drop for increasing k magnitudes.

With reference to FIG. 3C, instead of true periodicity along the grating lines, we now introduce a more realistic roughness variation. This leads to spreading of the diffraction peaks along $q_y$ direction. There is thus an increase in the width of the peak in that direction. The intensity distribution within the peak can be related to the power spectral density (PSD) of the roughness. In general the PSD is the Fourier transformation of the autocorrelation function of the roughness profile. It provides a representation of the amplitude of a surface's roughness as a function of the spatial frequency of the roughness. In this case, the spatial frequency is linearly related to the positions along the $q_y$ axis, and the diffraction intensities along the $q_y$ axis are proportional to the roughness PSD. The dashed rectangle shows the part of reciprocal space that is detected in a conventional SAXS or GI-SAXS experiment, which relies on weak scattering (Born approximation) which is only valid for hard x-rays. The dotted rectangles show the extent in k-space for detection of non-specular orders (h=−1, h=−1, h=+1, h=+2) in embodiments of the present invention.

Embodiments are easily implementable for small scattering angles, hence with periodicities much larger than the wavelength. In that case the embodiments are most sensitive for long-range components in LER/LWR. Long-range components will give rise to relatively small scattering angles and can be easily captured by an optical system which may have a limited Numerical Aperture (NA).

FIGS. 3A to 3C show the situation for a monochromatic illumination. However, for an inspection apparatus providing broadband illumination, the diffraction patterns are more complicated. This is illustrated in FIGS. 4A to 5B, again in reciprocal space or k-space, with $q_x$ and $q_y$ axes. In FIGS. 4A to 5B the large circle is the projection of the Ewald sphere onto the $q_z=0$ plane. The same principles hold as for the monochromatic case, although LER/LWR sensitivity per wavelength will be slightly different per wavelength (not shown in FIGS. 4B and 5B).

Figure 4A:
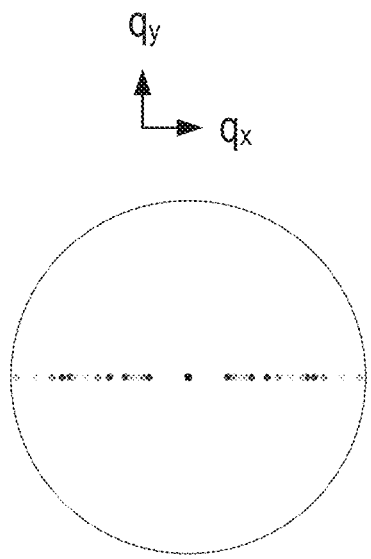
FIGS. 4A and 4B show schematically diffraction orders in k-space for a 1-D periodic structure with no roughness and with stochastic roughness respectively, both with broadband illumination.
Figure 4B:
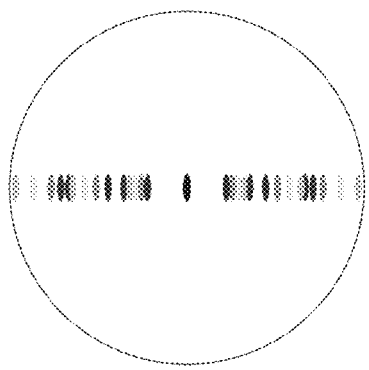

FIGS. 4A and 4B show schematically diffraction orders in k-space for a 1-D periodic structure with no roughness and with stochastic roughness respectively, both with broadband illumination. FIG. 4A shows the diffraction orders of 1-D ideal periodic target with no roughness (periodicity in x direction. The small dots with different greyscale correspond to the diffraction orders of different discrete wavelengths in the broadband illumination. FIG. 4B shows that LER/LWR gives broadening along $q_y$, with the intensity becoming distributed around the diffraction orders, shown as ovals having the same width as the dots of FIG. 4A.

Figure 5A:
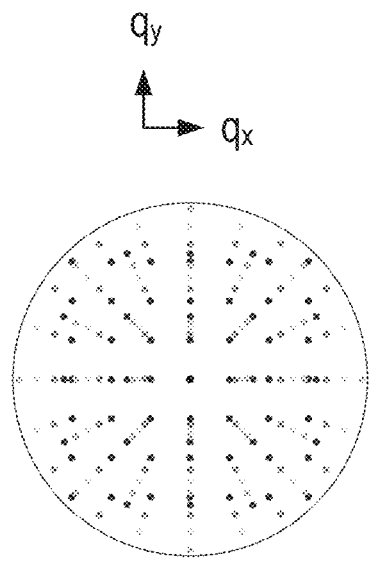
FIGS. 5A and 5B show schematically diffraction orders in k-space for a 2-D periodic structure with no roughness and with stochastic roughness respectively, both with broadband illumination.
Figure 5B:
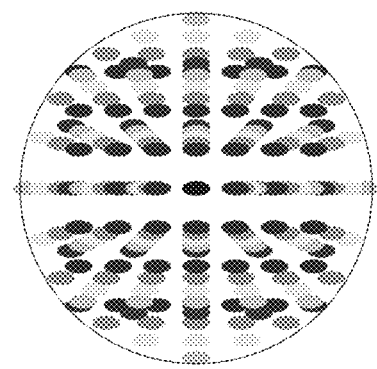

FIGS. 5A and 5B show schematically diffraction orders in k-space for a 2-D periodic structure with no roughness and with stochastic roughness respectively, both with broadband illumination. An example of a 2-D periodic structure is an array of contact holes. FIG. 5A illustrates the diffraction orders of a 2-D periodic target with no roughness. As for FIG. 4A, the small dots with different greyscale correspond to the diffraction orders of different discrete wavelengths in the broadband illumination. FIG. 5B shows different magnitudes of x and y contributions to roughness with different broadening along $q_x$ and $q_y$. The intensity becomes distributed around the diffraction orders, shown as ovals, in contrast to the dots of FIG. 5A.

Figure 6:
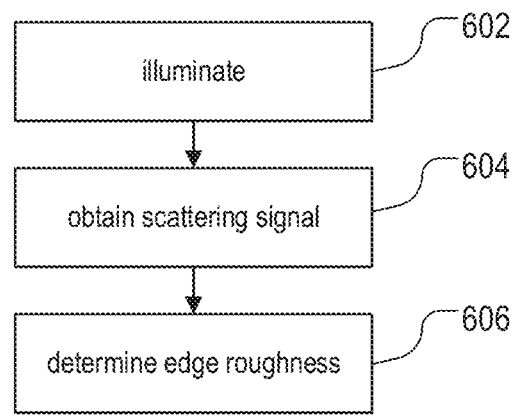
FIG. 6 is a flowchart of a method in accordance with an embodiment of the present invention.

FIG. 6 is a flowchart of a method of determining an edge roughness parameter of a periodic structure. In this example, the periodic structure is in a target on a substrate. The periodic structure comprises a lithographically patterned layer or stack. The periodic structure may be a photoresist structure or another material in one or more of the layers of the stack that is manufactured on the wafer. Embodiments may thus be used at "after etch inspection", where the periodic structure is etched into a layer of the integrated circuit target. The periodic structure may a structure periodic in one direction (such as a 1-D grating), or more than one direction (such as a 2-D array).

The periodic structure is illuminated 602 in an inspection apparatus such as described with reference to FIG. 2. The illumination radiation beam may comprise radiation with a wavelength in the range 1 nm to 100 nm, optionally, within the range from 5 nm to 50 nm, or optionally within the range from 10 nm to 20 nm. For example, it may have wavelength of 13.5 nm, which is commonly used in EUV lithography. In other embodiments, the illumination radiation beam may comprise radiation with longer wavelengths, including up to visible wavelengths.

The scattering signal may be obtained from a monochromatic or non-monochromatic radiation beam incident on the periodic structure. The non-monochromatic radiation beam may arise from a high-harmonic generation (HHG) illumination source. The non-monochromatic radiation beam incident on the periodic structure may then have a plurality of discrete wavelengths.

The scattering signal is preferably obtained from a radiation beam incident on a substrate comprising the periodic structure at an angle of incidence less than 70 degrees relative to an axis of the substrate perpendicular to its plane. This is different from grazing incidence SAXS (GI-SAXS) which is the only way to perform SAXS in reflection with hard x-rays. Typical GI-SAXS angles are few degrees from grazing. Embodiments of the present invention use nearer-normal rather than grazing incidence, such as less than 70 degrees, less than 45 degrees or less than 20 degrees. The reason for going to nearer-normal incidence is that there are more propagating diffraction orders. This maximizes the diversity and information content of the detected light in case of a 2-D periodic structure. Going away from normal incidence gives lower "$k_1$" values in one direction at the expense of "$k_1$" in the other direction ("$k_1$" is the pre-factor in the lithographer's equation, linewidth=$k_1$*wavelength/NA).

The method then has the following two steps:

At step 604, obtaining a scattering signal from a radiation beam scattered from the periodic structure. In this example, the scattering signal comprises a scattering intensity signal. It is obtained by detecting an image of a far-field diffraction pattern in the inspection apparatus.

At step 606, determining an edge roughness parameter, such as LER and/or LWR, based on a distribution of the scattering signal around a non-specular diffraction order. This may be done for example using a peak broadening model, as described further below with reference to FIG. 7.

Determining the LER and/or LWR may involve comparing the distribution of the scattering signal to calibration data. The calibration data may be empirical, such as distributions of scattering data obtained from calibration samples that have also been measured with an SEM. The calibration data may be simulated, such as distributions of scattering data obtained from a full simulation of the periodic structure and the illumination and detection. In another example of simulated calibration data, distributions of scattering data may be obtained from simple models based on physical assumptions.

Determining the LER and/or LWR may involve comparing the distribution of the scattering signal to estimated data. The estimated data may be distributions of scattering data generated by a model. The error between the distribution of the scattering signal and estimated data may be minimized by iteratively optimizing the model. The LER and/or LWR parameters may be optimized variables in the model or may be derived from optimized variables in the model.

Determining the edge roughness parameter may comprise determining the power spectral density of the edge roughness parameter based on the distribution of the scattering signal.

The critical dimension uniformity (CDU) value may be determined based on the determined LER and/or LWR.

The calculation of the edge roughness parameters may be based on a shape of the non-specular diffraction order in the scattering signal. The calculation may be based on the distribution of the scattering signal around the non-specular diffraction order in a reciprocal-space direction perpendicular to a direction associated with periodicity of the periodic target. In FIG. 3C, this perpendicular reciprocal-space direction is $q_y$ and the distribution of the order and therefore the scattering signal is shown as an oval extending longer in that direction. The width of the non-specular diffraction order in the scattering signal in the $q_y$ direction may therefore be used to determine the LER and/or LWR.

In the case of a 2-D periodic structure, a first distribution of the scattering signal around a first non-specular diffraction order (e.g. $1^{st}$ order) for a first direction of periodicity of the periodic structure (e.g. $q_y$) may be used to determine the LER and/or LWR. A second distribution of the scattering signal around a second non-specular diffraction order, having a different index from the first non-specular diffraction order (e.g. $2^{nd}$ order), for a second direction of periodicity of the periodic structure (e.g. $q_x$) may also be used.

The method may be implemented in an inspection apparatus for inspection of a periodic structure on a substrate. The inspection apparatus, such as described with reference to FIG. 2, has:

(a) a radiation source 310 arranged to illuminate a region of the substrate W with a radiation beam 356:

(b) a detector 318 arranged to detect a scattered radiation beam 360 scattered from the periodic structure so as to provide a scattering signal 382;

(c) a processor 320 operable to control the inspection apparatus so as to carry out the method described with reference to FIG. 6.

Different embodiments of the inspection apparatus may have features to perform the actions/steps of the different embodiments of the method.

As described with reference to FIG. 6, the periodic structure is in a target on a substrate. Embodiments of the inspection apparatus may be used for example at "after develop inspection" or "after etch inspection".

The periodic structure may be illuminated by radiation source 310, although other radiation sources may be used to provide radiation with a suitable wavelength. The radiation source may be configured to provide illumination radiation with a wavelength in the range 1 nm to 100 nm, optionally, within the range from 5 nm to 50 nm, or optionally within the range from 10 nm to 20 nm. For example, it may have wavelength of 13.5 nm, which is commonly used in EUV lithography. In other embodiments, the illumination radiation beam may comprise radiation with longer wavelengths, including up to visible wavelengths.

The scattering signal may be obtained from a monochromatic or non-monochromatic radiation 356 beam incident on the periodic structure. The non-monochromatic radiation beam may arise from a high-harmonic generation (HHG) illumination source 310. The non-monochromatic radiation beam incident on the periodic structure may then have a plurality of discrete wavelengths.

The scattering signal is preferably obtained from a radiation beam incident on a substrate comprising the periodic structure at an angle of incidence less than 70 degrees relative to an axis of the substrate perpendicular to its plane. Embodiments of the inspection apparatus use nearer-normal rather than grazing incidence, such as less than 70 degrees (as shown in FIG. 2), less than 45 degrees or less than 20 degrees.

Detector 318 thus obtains the scattering signal 382 from radiation beam 360 scattered from the periodic structure. In this example, the scattering signal 382 comprises a scattering intensity signal. It is obtained by detecting an image of a far-field diffraction pattern in the inspection apparatus.

The MPU 320, or another processor (which may be distributed over more than one processing unit), determines an edge roughness parameter, such as LER and/or LWR, based on a distribution of the scattering signal around a non-specular diffraction order. This may be done for example using a peak broadening model, as described further below with reference to FIG. 7.

In the same was as described with reference to FIG. 6, the MPU can determine the LER and/or LWR by comparing the distribution of the scattering signal to calibration data or to estimated data.

The MPU may determine the edge roughness parameter by determining the power spectral density of the edge roughness parameter based on the distribution of the scattering signal.

The MPU may determine a critical dimension uniformity (CDU) value based on the determined LER and/or LWR.

The MPU's calculation of the edge roughness parameters may be based on a shape of the non-specular diffraction order in the scattering signal in the same way as described with reference to FIG. 6.

Figure 7:
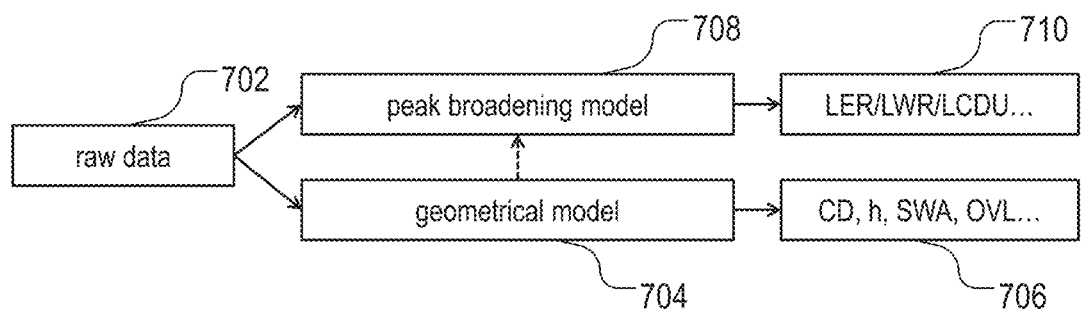
FIG. 7 shows schematically the data flow of determining edge roughness parameters in accordance with an embodiment of the present invention.

FIG. 7 shows schematically the data flow of determining edge roughness parameters in accordance with an embodiment of the present invention.

Raw scattering signal data 702 is obtained from an inspection apparatus, as described above. Geometrical parameters 706, such as CD, h (height). Side Wall Angle (SWA) and overlay (OVL) are typically reconstructed based on a geometrical model 704 of the target and using a rigorous electromagnetic solver for periodic unit cells. Roughness parameters are more difficult to solve rigorously (because there is no periodicity).

Determining an edge roughness parameter 710, such as LER and/or LWR and LCDU, based on a distribution of the scattering signal around a non-specular diffraction order, may be performed using a peak broadening model 708. In this example, this involves determination of peak widths for example by curve fitting. The peak widths may be determined with input from geometrical model 704, for example, using unit cell pitch to identify the diffraction peaks.

The relation between peak width and roughness parameter may be determined by calibration to reference tool (e.g. CD-SEM), for example using a set/get experiment. The relation between peak width and roughness parameter may be determined using a rigorous electromagnetic solver (e.g. finite element modeling). Strategies may be used to keep computation time in check, for example, by only using nominal geometrical parameters.

The relation between peak width and roughness parameter may be determined using machine learning to find an optimal control strategy for any relevant observable (e.g. yield) plus one or more control parameter (e.g. etch time).

Embodiments of the present invention use spectrally-resolved small angle scattering and have good sensitivity for LER/LWR. No additional hardware or complex optics are required, because the shape of a diffraction peak can easily be resolved by a 2-D camera.

An embodiment of the invention may be implemented using a computer program containing one or more sequences of computer-readable instructions describing methods of determining an edge roughness parameter of a periodic structure, as described above. This computer program may be executed on suitable computing apparatus. For example it may be executed within the Supervisory Control System (SCS) of FIG. 1 or Metrology Processing Unit (MPU) of FIG. 2, or some other controller. There may also be provided a data storage medium (e.g., semiconductor memory, magnetic or optical disk) having such a computer program stored therein.

Figure 8:
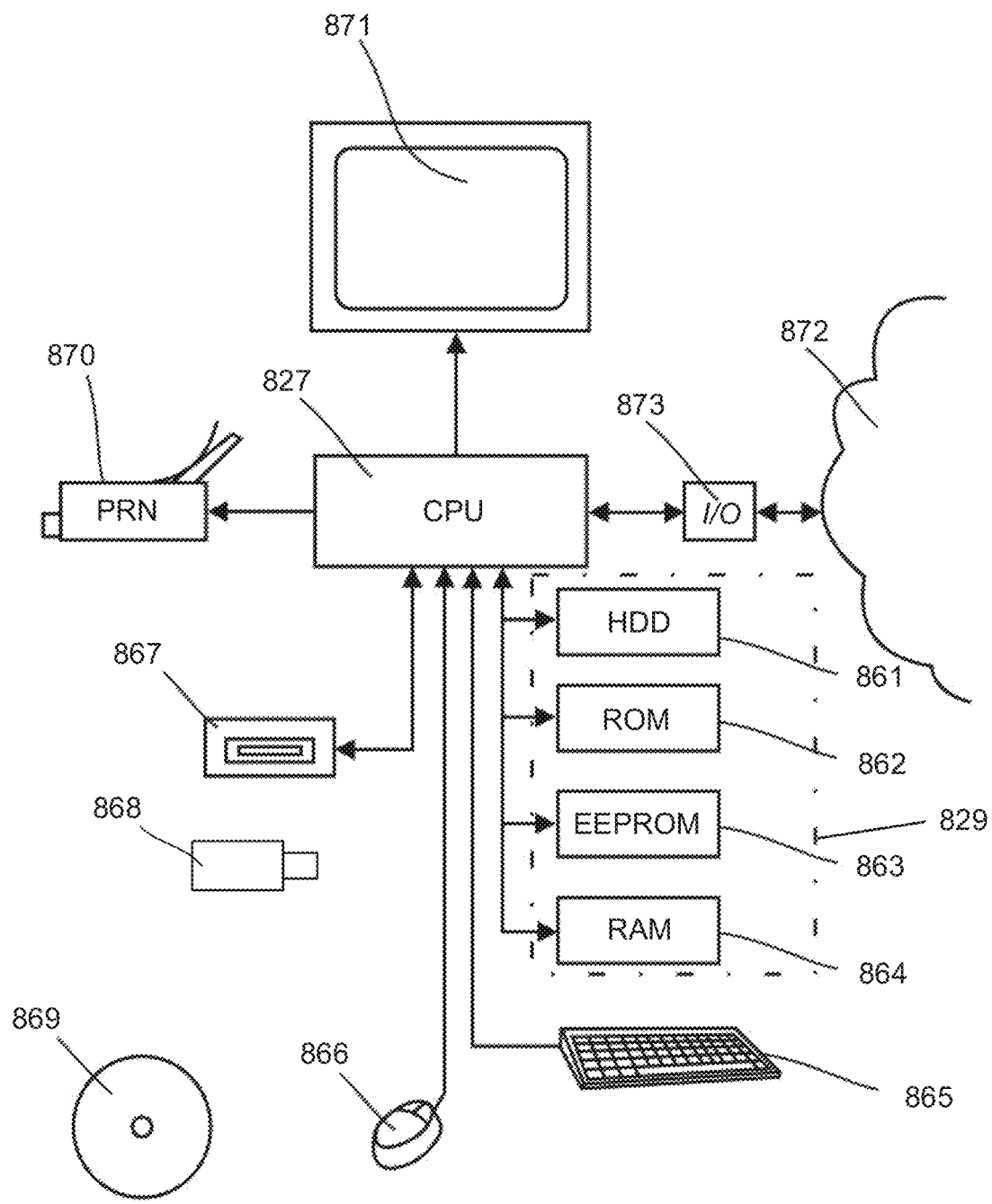
FIG. 8 shows computer apparatus useful in implementing the methods disclosed herein.

This control unit MPU may include a computer assembly as shown in FIG. 8. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CD-ROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an embodiment of the invention external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computing apparatus may be any signal processing system with analogue and/or digital and/or software technology arranged to perform the functions discussed herein.

The target structures described above may be metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice the features and/or spaces of the gratings may be made to include smaller structures similar in dimension to the product features.

Further embodiments are defined in the following numbered clauses:

1. A method of determining an edge roughness parameter of a periodic structure, the method comprising:
    obtaining a scattering signal from a radiation beam scattered from the periodic structure; and
    determining an edge roughness parameter based on a distribution of the scattering signal around a non-specular diffraction order.

2. The method of clause 1, wherein the step of determining an edge roughness parameter comprises comparing the distribution of the scattering signal to calibration data or to estimated data.

3. The method of clause 1 or clause 2, wherein determining the edge roughness parameter comprises determining the power spectral density of the edge roughness parameter based on the distribution of the scattering signal.

4. The method of any preceding clause, further comprising the step of determining a critical dimension uniformity) value based on the determined edge roughness parameter of the periodic structure.

5. The method of any preceding clause, wherein determining the edge roughness parameter is based on a shape of the non-specular diffraction order in the scattering signal.

6. The method of any preceding clause, wherein determining an edge roughness parameter is based on a distribution of the scattering signal around the non-specular diffraction order in a reciprocal-space direction perpendicular to a direction associated with periodicity of the periodic target.

7. The method of clause 6, wherein determining the edge roughness parameter is based on width of the non-specular diffraction order in the scattering signal in the reciprocal-space direction perpendicular to the direction associated with periodicity of the periodic target.

8. The method of any preceding clause, wherein the radiation beam comprises radiation with a wavelength in the range 1 nm to 100 nm, optionally, within the range from 5 nm to 50 nm, or optionally within the range from 10 nm to 20 nm.

9. The method of any preceding clause, wherein the radiation beam comprises radiation with a wavelength of 13.5 nm.

10. The method of any preceding clause, wherein the scattering signal is obtained from a non-monochromatic radiation beam incident on the periodic structure.

11. The method of clause 10 wherein the non-monochromatic radiation beam arises from a high-harmonic generation source.

12. The method of clause 10 or clause 11, wherein non-monochromatic radiation beam incident on the periodic structure comprises a plurality of discrete wavelengths.

13. The method of any preceding clause, wherein the scattering signal is obtained from a radiation beam incident on a substrate comprising the periodic structure at an angle of incidence less than 70 degrees relative to an axis of the substrate perpendicular to its plane.

14. The method of any preceding clause, wherein the scattering signal comprises a scattering intensity signal.

15. The method of any preceding clause, wherein obtaining a scattering signal comprises detecting an image of a far-field diffraction pattern.

16. The method of any preceding clause, wherein the periodic structure comprises a grating.

17. The method of any preceding clause, wherein the periodic structure comprises a structure periodic in more than one direction.

18. The method of clause 17 comprising determining an edge roughness parameter based on:
    a first distribution of the scattering signal around a first non-specular diffraction order for a first direction of periodicity of the periodic structure; and
    a second distribution of the scattering signal around a second non-specular diffraction order, having a different index from the first non-specular diffraction order, for a second direction of periodicity of the periodic structure.

19. The method of any preceding clause, wherein the periodic structure comprises a lithographically patterned layer or stack.

20. An inspection apparatus for inspection of a periodic structure on a substrate, the inspection apparatus comprising:
    (a) a radiation source arranged to illuminate a region of the substrate with a radiation beam;
    (b) a detector arranged to detect a scattered radiation beam scattered from the periodic structure so as to provide a scattering signal;

(c) a processor operable to control the inspection apparatus so as to carry out the method of any of clauses 1 to 19.

21. A computer program comprising computer readable instructions which, when run on suitable computer apparatus, cause the computer apparatus to perform the method of any of clauses 1 to 19.

22. A computer program product comprising the computer program of clause 21.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments reveals the general nature of embodiments of the invention such that others can, by applying knowledge within the skill of the art, readily modify, and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining an edge roughness parameter of a periodic structure, the method comprising:
   illuminating, using a radiation source, the periodic structure with a radiation beam;
   detecting, using a detector, a radiation beam scattered from the periodic structure;
   obtaining a scattering signal from the radiation beam scattered from the periodic structure; and
   determining an edge roughness parameter based on a distribution of the scattering signal around a non-specular diffraction order.

2. The method of claim 1, wherein the determining comprises comparing the distribution of the scattering signal to calibration data or to estimated data.

3. The method of claim 1, wherein the determining comprises determining a power spectral density of the edge roughness parameter based on the distribution of the scattering signal.

4. The method of claim 1, further comprising:
   determining a critical dimension uniformity value based on the determined edge roughness parameter of the periodic structure.

5. The method of claim 1, wherein the determining is based on a shape of the non-specular diffraction order in the scattering signal.

6. The method claim 1, wherein the determining is based on a distribution of the scattering signal around the non-specular diffraction order in a reciprocal-space direction perpendicular to a direction associated with periodicity of the periodic target.

7. The method of claim 6, wherein the determining is based on a width of the non-specular diffraction order in the scattering signal in the reciprocal-space direction perpendicular to the direction associated with periodicity of the periodic target.

8. The method of claim 1, wherein the radiation beam comprises radiation with a wavelength in the range 1 nm to 100 nm, 5 nm to 50 nm, or 10 nm to 20 nm.

9. The method of claim 1, wherein the radiation beam comprises radiation with a wavelength of 13.5 nm.

10. The method of claim 1, wherein the scattering signal is obtained from a non-monochromatic radiation beam incident on the periodic structure.

11. The method of claim 10, wherein the non-monochromatic radiation beam arises from a high-harmonic generation source.

12. The method of claim 10, wherein the non-monochromatic radiation beam incident on the periodic structure comprises a plurality of discrete wavelengths.

13. The method of claim 1, wherein the scattering signal is obtained from a radiation beam incident on a substrate comprising the periodic structure at an angle of incidence less than 70 degrees relative to an axis of the substrate perpendicular to its plane.

14. The method of claim 1, wherein the scattering signal comprises a scattering intensity signal.

15. The method of claim 1, wherein the periodic structure comprises a grating.

16. The method of claim 1, wherein the periodic structure comprises a structure periodic in more than one direction.

17. The method of claim 16, wherein the determining is based on:
   a first distribution of the scattering signal around a first non-specular diffraction order for a first direction of periodicity of the periodic structure; and
   a second distribution of the scattering signal around a second non-specular diffraction order, having a different index from the first non-specular diffraction order, for a second direction of periodicity of the periodic structure.

18. The method of claim 1, wherein the periodic structure comprises a lithographically patterned layer or stack.

19. An inspection apparatus for inspection of a periodic structure on a substrate, the inspection apparatus comprising:
   a radiation source arranged to illuminate a region of the substrate with a radiation beam;
   a detector arranged to detect a scattered radiation beam scattered from the periodic structure so as to provide a scattering signal;
   a processor operable to control the inspection apparatus so as to carry out operations comprising determining an edge roughness parameter of a periodic structure, the operations comprising:
      obtaining a scattering signal from a radiation beam scattered from the periodic structure; and
      determining an edge roughness parameter based on a distribution of the scattering signal around a non-specular diffraction order.

20. A method comprising:

illuminating, using a radiation source, a periodic structure comprising a structure periodic in more than one direction with a radiation beam;

detecting, using a detector; a radiation beam scattered from the periodic structure; and using a non-transient computer readable medium comprising computer readable instructions which; when run on a suitable computer apparatus, cause the computer apparatus to perform operations for determining an edge roughness parameter of the periodic structure, the operations comprising:

obtaining a scattering signal from the radiation beam scattered from the periodic structure; and determining an edge roughness parameter based on a distribution of the scattering signal around a non-specular diffraction order, wherein the determining is based on:

a first distribution of the scattering signal around a first non-specular diffraction order for a first direction of periodicity of the periodic structure; and a second distribution of the scattering signal around a second non-specular diffraction order, having a different index from the first non-specular diffraction order, for a second direction of periodicity of the periodic structure.

\* \* \* \* \*

UNITED STATES PATENT AND TRADEMARK OFFICE
CERTIFICATE OF CORRECTION

PATENT NO. : 10,725,387 B2
APPLICATION NO. : 16/028917
DATED : July 28, 2020
INVENTOR(S) : Coenen et al.

Page 1 of 1

It is certified that error appears in the above-identified patent and that said Letters Patent is hereby corrected as shown below:

In the Claims

Column 21, Line 8, please replace "instructions which; when" with --instructions which, when--.

Signed and Sealed this
Eighth Day of September, 2020

Andrei Iancu
*Director of the United States Patent and Trademark Office*